(12) United States Patent
Casperson

(10) Patent No.: US 8,058,547 B1
(45) Date of Patent: Nov. 15, 2011

(54) CONCENTRATING SOLAR PANEL

(76) Inventor: John R. Casperson, Pensacola, FL (US)

( * ) Notice: Subject to any disclaimer, the term of this patent is extended or adjusted under 35 U.S.C. 154(b) by 203 days.

(21) Appl. No.: 12/283,062

(22) Filed: Sep. 9, 2008

Related U.S. Application Data

(60) Provisional application No. 60/944,108, filed on Sep. 17, 2007, provisional application No. 61/011,675, filed on Jan. 19, 2008.

(51) Int. Cl.
*H01L 31/042* (2006.01)

(52) U.S. Cl. ........................................ 136/246; 136/244

(58) Field of Classification Search ................... None
See application file for complete search history.

(56) References Cited

U.S. PATENT DOCUMENTS

| | | | |
|---|---|---|---|
| 4,003,638 A | 1/1977 | Winston | |
| 4,045,246 A | 8/1977 | Mlavsky et al. | |
| 4,069,812 A | 1/1978 | O'Neill | |
| 4,312,330 A * | 1/1982 | Holdridge | 126/698 |
| 4,321,417 A | 3/1982 | Kurth et al. | |
| 4,409,963 A * | 10/1983 | Mori | 126/573 |
| 5,096,505 A | 3/1992 | Fraas et al. | |
| 5,118,361 A * | 6/1992 | Fraas et al. | 136/246 |
| 5,123,968 A | 6/1992 | Fraas et al. | |
| 5,167,724 A | 12/1992 | Chiang | |
| 5,971,551 A | 10/1999 | Winston et al. | |
| 6,630,622 B2 | 10/2003 | Konold | |
| 2005/0081908 A1 | 4/2005 | Stewart | |
| 2007/0113883 A1 * | 5/2007 | Rhee et al. | 136/246 |

OTHER PUBLICATIONS

Sala et al., "Test, Rating and Specification of PV Concentrator Components and Systems"(1999) pp. 28-47, http://www.ies-def.upm.es/ies/CRATING/Chapter4.pdf.
Najarian et al., "Thermoelectrics and Photovoltaics: Integration Challenges and Benefits" (Dec. 13, 2006) http://kammen.berkeley.edu/C226/5r.pdf.
Parker Automation., Hydraulic Rotary Actuators, Catalog 1800/USA, (1998 Parker Hannifin) pp. I-VI.
Cheknane et al., "Performance of concentrator solar cells with passive cooling" (Jan. 4, 2006 IOP Publishing, UK) Semicond. Sci. Technol., 21 (2006) 144-147.
Winston et al., "Nonimaging Optics", Chapter 4: Nonimaging Optical Systems, (2004) pp. 43-68 Elsevier, Boston.

* cited by examiner

*Primary Examiner* — Alexa Neckel
*Assistant Examiner* — Shannon Gardner
(74) *Attorney, Agent, or Firm* — John R Casperson

(57) ABSTRACT

A photovoltaic device is disclosed comprising a concentrator and a collector. The concentrator is to concentrate solar energy, and the collector is positioned to receive solar energy from the concentrator. The concentrator comprises a plurality of identical flat linear fresnel prism sheets and the collector comprises a plurality of identical photovoltaic cells. The prism sheets are selected from the group consisting of square prism sheets and regular hexagonal prism sheets, and the cells, in a preferred embodiment, are selected from the group consisting of square cells where the prism sheets comprise square prism sheets and regular hexagonal cells where the prism sheets comprise hexagonal prism sheets. Each of the cells is sized substantially the same as the prism sheets and receives superposed beams of light from the prism sheets, each cell receiving superposed beams of light from four prism sheets where prism sheets are square, and superposed beams of light from six prism sheets where the prism sheets are hexagonal.

5 Claims, 3 Drawing Sheets

CONCENTRATING SOLAR PANEL

CROSS REFERENCES TO RELATED APPLICATIONS

This application claims the benefit of U.S. Provisional Application No. 60/994,108 filed Sep. 17, 2007 and U.S. Provisional Application No. 61/011,675 filed Jan. 19, 2008, the disclosures of which are incorporated by reference herein.

FIELD OF THE INVENTION

This invention relates to concentrating solar panels.

BACKGROUND OF THE INVENTION

Rhee et al, US Pub. No.: 2007/0113883, published May 27, 2007, employs Fresnel prism sheets to superpose beams of light on a photovoltaic cell. However, a multiplicity of different types of prism sheets are required to carry out superposition as described therein. Also, the superposing prism sheets are linearly aligned in series as their distance from the photovoltaic cell increases, resulting in a thick panel which is unwieldy for use with a tracker.

A device which is more simple and compact would be desirable.

OBJECTS OF THE INVENTION

It is an object of this invention to provide a device for concentrating sunlight.

It is a further object of this invention to provide a device for converting sunlight into electricity.

It is another object of this invention to provide a device which is efficient for its intended purpose.

It is another object of this invention to provide a device which is simple and compact and relatively inexpensive to produce.

SUMMARY OF THE INVENTION

A photovoltaic device is disclosed comprising a concentrator and a collector. The concentrator is to concentrate solar energy, and the collector is positioned to receive solar energy from the concentrator. The concentrator comprises a plurality of identical flat linear fresnel prism sheets and the collector comprises a plurality of identical photovoltaic cells. The prism sheets are selected from the group consisting of square prism sheets and regular hexagonal prism sheets, and the cells, in a preferred embodiment, are selected from the group consisting of square cells where the prism sheets comprise square prism sheets and regular hexagonal cells where the prism sheets comprise hexagonal prism sheets. Each of the cells is sized substantially the same as the prism sheets and receives superposed beams of light from the prism sheets, each cell receiving superposed beams of light from four prism sheets where prism sheets are square, and superposed beams of light from six prism sheets where the prism sheets are hexagonal.

DETAILED DESCRIPTION OF THE INVENTION

Figure 1:
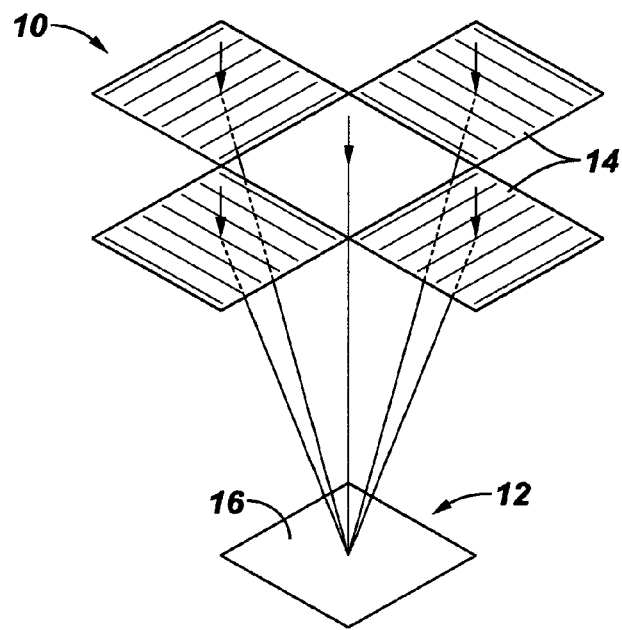
FIG. 1 schematically illustrates certain principles of an embodiment of the invention employing square prism sheets.
Figure 3:
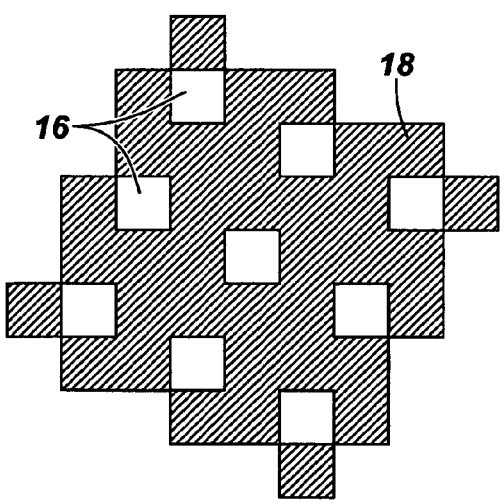
FIG. 3 is a top schematic view of a solar collector for use with the concentrator in FIG. 2.
Figure 4:
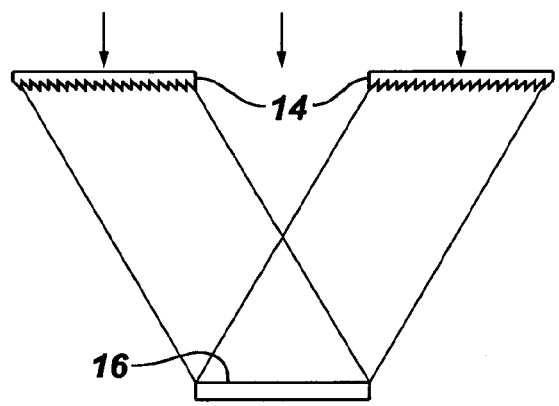
FIG. 4 schematically illustrates further principles of an embodiment of the invention from a side perspective.
Figure 5:
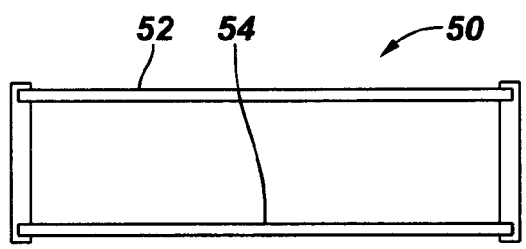
FIG. 5 schematically illustrates a solar panel constructed according to certain embodiments of the invention.
Figure 6:
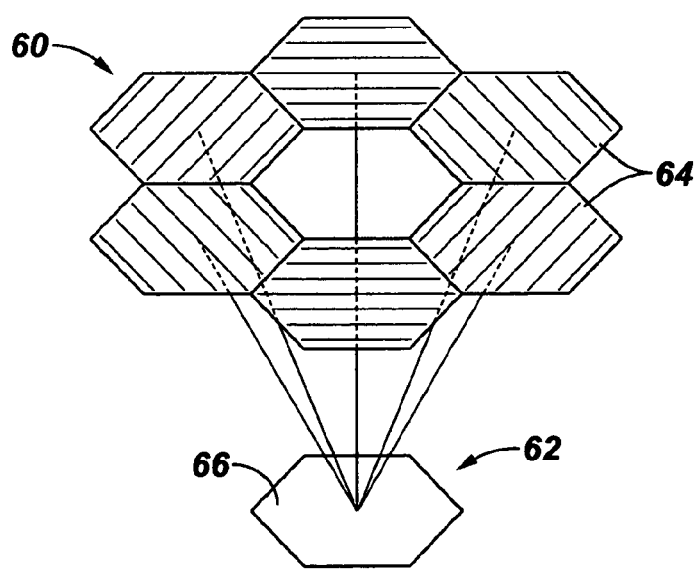
FIG. 6 schematically illustrates certain principles of an embodiment of the invention employing hexagonal prism sheets.

According to one embodiment of the invention, a photovoltaic device comprises a concentrator (10 in FIG. 1, 60 in FIG. 6) and a collector (12 in FIG. 1, 62 in FIG. 6). The concentrator is to concentrate solar energy, and the collector is positioned to receive solar energy from the concentrator. The concentrator comprises a plurality of identical flat linear fresnel prism sheets and the collector comprises a plurality of identical photovoltaic cells. The prism sheets are selected from the group consisting of square prism sheets (14 in FIGS. 1 and 2) and regular hexagonal prism sheets (64 in FIGS. 6 and 7), and the cells are preferably selected from the group consisting of square cells (16 in FIGS. 1-3) where the prism sheets comprise square prism sheets and regular hexagonal cells (66 in FIGS. 6-7) where the prism sheets comprise hexagonal prism sheets. Each of the cells is sized substantially the same as the prism sheets and receives superposed beams of light from the prism sheets, each cell receiving superposed beams of light from four prism sheets where the prism sheets are square, and superposed beams of light from six prism sheets where the prism sheets are hexagonal. The principle is illustrated in FIG. 4.

Figure 2:
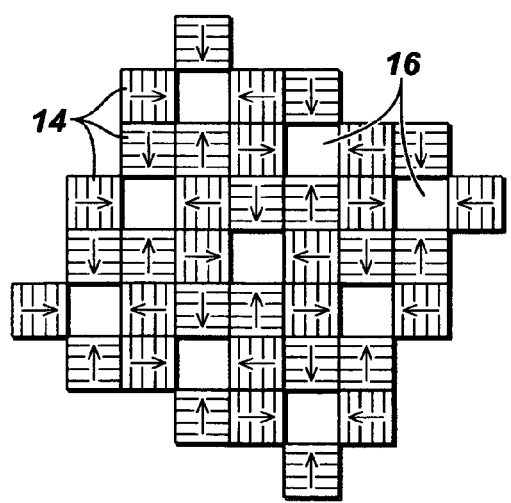
FIG. 2 is a top schematic view of a solar concentrator employing the superposition principles illustrated in FIG. 1.
Figure 7:
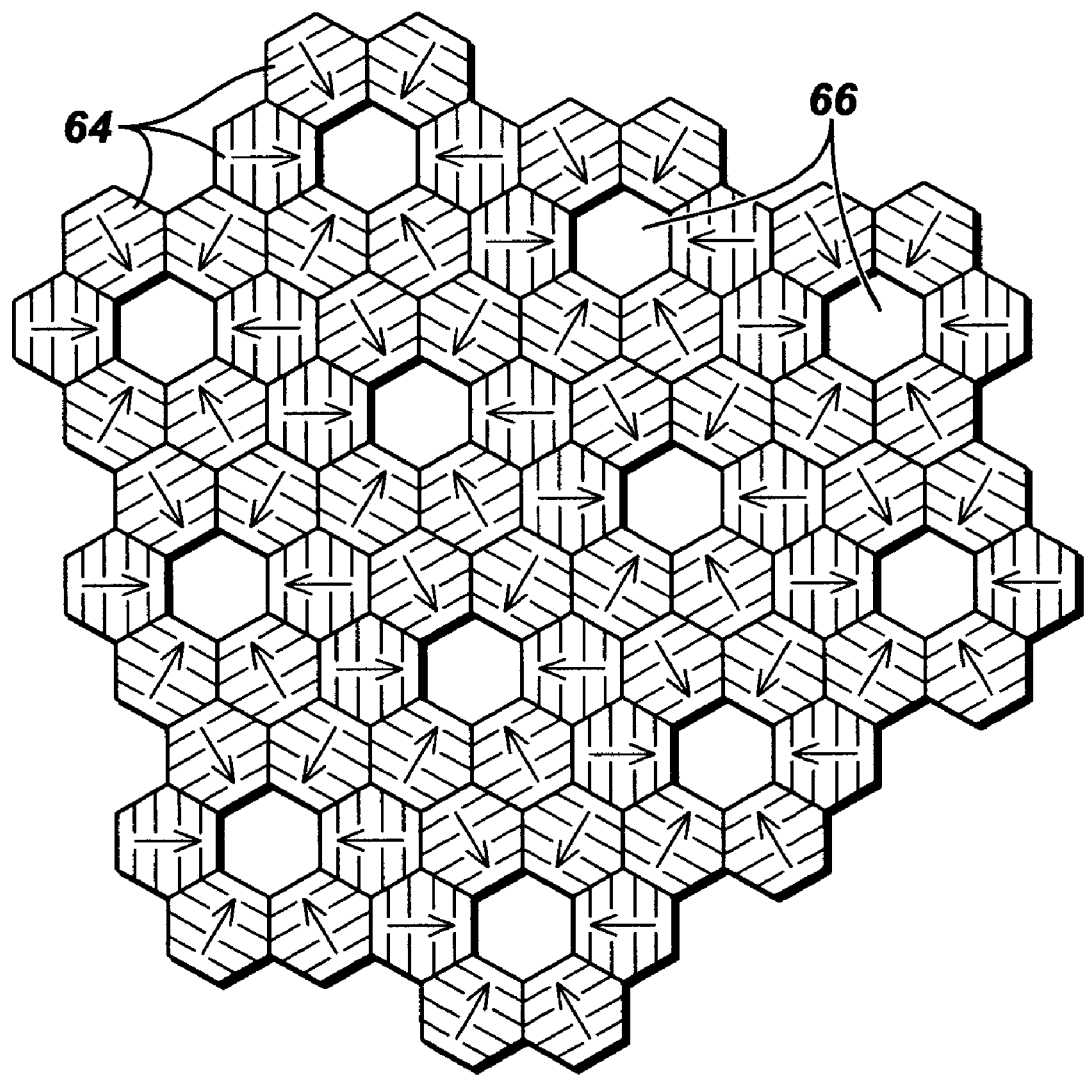
FIG. 7 is a top schematic view of a solar concentrator employing the superposition principles illustrated in FIG. 6.

The fresnel prism sheets employed in the invention comprise linear nonimaging fresnel prism sheets, which are transparent sheets containing large numbers of parallel linear prismatic elements with constant prism and relief angles. In FIGS. 1-2 and 6-7, the parallel lines represent the parallel prismatic elements. In FIGS. 2 and 7, the arrowheads indicate the refraction direction of the sheets. It is possible to stamp such prism sheets from polymethylmethacrylate (PMMA) or other clear plastic, and then cut them to the desired size, shape and prism orientation. For both the square sheet and hexagonal sheet embodiments, the molded blanks are trimmed so that the parallel linear prismatic elements are parallel to one of the side edges of the sheet.

The device is as used is generally in the form of a solar panel 50. In this arrangement, the plurality of flat linear fresnel prism sheets is positioned in a first plane 52 and the plurality of photovoltaic cells is positioned in a second plane 54 which is parallel to and spaced apart from the first plane. The cells are spaced apart from each other in a regular repeating pattern. (See FIG. 3, for example) The prism sheets are arranged in a repeating pattern, with square prism sheets being arranged in sets of four and hexagonal prism sheets in sets of six. See FIGS. 2 and 7.

For square prism sheets, the sheets are positioned in a plurality of adjacent open-center cross shaped sets of 4 to form the concentrator. For hexagonal prism sheets, the sheets are positioned in a plurality of adjacent open center ring-shaped sets of 6 to form the concentrator. The linear fresnel elements of the sheets refract beams of light to intersect beneath the open centers of the sets. A tracker is used to keep the concentrator normal to the sun.

Where the prism sheets and the cells are square, in the range of 75 to 80 percent of the concentrator comprises fresnel prism sheets, based on area. Where the prism sheets and the cells are hexagonal, in the range of 82 to 87 percent of the concentrator comprises fresnel prism sheets, based on area. The areas in the first plane which are in superposition to the photovoltaic cells are unoccupied by prism sheets. The edges of the fresnel prism sheets are parallel to the edges of the photocells in the preferred embodiments.

Generally, the collector comprises at least one plate 18 having a front side and a back side, and at least one photovoltaic cell is mounted on the front side of each plate.

Generally, the incoming normal solar energy is refracted by the fresnel prism sheets at an angle in the range of 10 degrees to 45 degrees, usually in the range of 15 to 35 degrees. As the refraction angle increases, the amount of solar energy transmitted decreases.

A panel constructed of units as illustrated in FIGS. 1-2 will provide near 5 suns to each photocell, one sun from each of the 4 fresnel lenses, plus normal light directly impinging the photocell from the unoccupied area. The panel contains about 4 times as many fresnel lenses as it does photocells of the same size. A panel constructed of units as illustrated in FIGS. 6-7 will provide near 7 suns to photocell, one sun from each of the 6 fresnel lenses, plus normal light directly impinging the photocell from the unoccupied area.

The panel 50 comprises an upper array of fresnel lenses and a lower array of photovoltaic cells. A frame retains the arrays in parallel relationship. The arrays can be constructed of heavy wire, with both the photocells (encased in suitable protective containers) and the fresnel lenses being retained by clips. The photocells can be mounted on a copper or aluminum plate which is provided with fins for passive cooling if desired.

The panel as shown in FIG. 2 comprises 9 photocells. Twelve volt panels are typically constructed of 36 photocells in the case of mono- or polycrystalline silicon cells, and would be formed from 4 of the units shown in FIG. 2. When using 6 inch squared photocells and fresnels, the panel would measure 7.25 feet across. Peak power output, at 15% cell efficiency, and ignoring losses, would be about 630 watts at about 19.8 volts, assuming 0.55 volts/cell with cells wired in series. The panel would be useful in conjunction with a 2-axis tracker for charging a 12V battery or providing input to a DC/AC inverter, for example.

For a panel constructed as shown in FIGS. 6-7, 6 inch hexagons, and a prism sheet which diffracts at 30 degrees can be used. With these dimensions, the fresnel lens plane will be separated from the PV plane by a distance of about one foot. A panel on the order of 10 feet in diameter will produce about 1000 peak watts, ignoring losses.

Heat sinks can be mounted behind each cell, to the back side of the plates. Heat pumps, for example, Peltier coolers, can also be employed, mounted between the heat sink and the plate. The coolers would be operated to run the PV cells at a temperature increase of less than, say, 50 degrees C., rather than attempting to operate them below ambient temperatures. Under these conditions, it is expected that in the range of 5 to 10 percent of the electrical energy produced by the device will be consumed by the Peltier coolers. At 7× magnification, however, it is expected that Silicon-based cells will operate on the order of 10% greater efficiency.

In both embodiments, the panels are employed with 2-axis trackers connected to their frames to position the fresnel prism sheets at right angles to the incoming solar energy.

While certain preferred embodiments of the invention have been described herein, the invention is not to be construed as being so limited, except to the extent that such limitations are found in the claims.

The invention claimed is:

1. A photovoltaic device comprising
    a concentrator to concentrate solar energy, said concentrator comprising a plurality of sets of identical flat linear fresnel prism sheets, said prism sheets being selected from the group consisting of identical square prism sheets and identical regular hexagonal prism sheets, and
    a collector positioned to receive solar energy from the concentrator, said collector comprising a plurality of identical photovoltaic cells, each photovoltaic cell being positioned to receive refracted light from a different set of prism sheets,
    each photovoltaic cell being selected from the group consisting of a square photovoltaic cell where the prism sheets consist of square prism sheets and a regular hexagonal photovoltaic cell where the prism sheets consist of hexagonal prism sheets,
    each photovoltaic cell being sized the same as each prism sheet and receiving superposed beams of light from its own set of prism sheets, wherein each photovoltaic cell receives superposed beams of refracted light from only four prism sheets where the photovoltaic cell and prism sheets are square, and wherein each photovoltaic cell receives superposed beams of refracted light from only six prism sheets wherein the photovoltaic cell and prism sheets are hexagonal,
    and wherein for square prism sheets, the sheets are positioned in a plurality of adjacent cross-shaped sets of 4 to form the concentrator and for hexagonal prism sheets, the sheets are positioned in a plurality of adjacent ring-shaped sets of 6 to form the concentrator,
    the prism sheets being arranged in a repeating pattern of prism sheet sets.

2. A photovoltaic device as in claim 1 wherein the plurality of flat linear fresnel prism sheets is positioned in a first plane and the plurality of photovoltaic cells is positioned in a second plane which is parallel to and spaced apart from the first plane.

3. A photovoltaic device as in claim 2 wherein the prism sheets and the photovoltaic cells are square and in the range of 75 to 80 percent of the concentrator comprises fresnel prism sheets, based on area.

4. A photovoltaic device as in claim 2 wherein the prism sheets consist of hexagonal prism sheets and the photovoltaic cells are hexagonal and in the range of 82 to 87 percent of the concentrator comprises fresnel prism sheets, based on area.

5. A photovoltaic device as in claim 2 wherein areas in the first plane which are in superposition to the photovoltaic cells are unoccupied by prism sheets.

* * * * *